(12) United States Patent
Halpert et al.

(10) Patent No.: US 7,394,094 B2
(45) Date of Patent: Jul. 1, 2008

(54) SEMICONDUCTOR NANOCRYSTAL HETEROSTRUCTURES

(75) Inventors: Jonathan E. Halpert, Cambridge, MA (US); Moungi G. Bawendi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 195 days.

(21) Appl. No.: 11/320,316

(22) Filed: Dec. 29, 2005

(65) Prior Publication Data

US 2007/0152236 A1    Jul. 5, 2007

(51) Int. Cl.
*H01L 35/24* (2006.01)
*H01L 51/00* (2006.01)

(52) U.S. Cl. .................. 257/40; 257/E39.007
(58) Field of Classification Search .......... 257/9–18, 257/40, E39.007
See application file for complete search history.

(56) References Cited

U.S. PATENT DOCUMENTS

| | | | |
|---|---|---|---|
| 4,882,609 A | 11/1989 | Schubert et al. |
| 5,021,360 A | 6/1991 | Melman et al. |
| 5,081,511 A | 1/1992 | Tehrani et al. |
| 5,262,357 A | 11/1993 | Alivisatos et al. |
| 5,293,050 A | 3/1994 | Chapple-Sokol et al. |
| 5,354,707 A | 10/1994 | Chapple-Sokol et al. |
| 5,395,791 A | 3/1995 | Cheng et al. |
| 5,412,231 A | 5/1995 | Furuya |
| 5,422,489 A | 6/1995 | Bhargava |
| 5,434,878 A | 7/1995 | Lawandy |
| 5,481,397 A | 1/1996 | Burt |
| 5,492,080 A | 2/1996 | Ohkawa et al. |
| 5,499,260 A | 3/1996 | Takahashi et al. |
| 5,505,928 A | 4/1996 | Alivisatos et al. |
| 5,515,393 A | 5/1996 | Okuyama et al. |
| 5,525,377 A | 6/1996 | Gallagher et al. |
| 5,537,000 A | 7/1996 | Alivisatos et al. |
| 5,541,948 A | 7/1996 | Krupke et al. |
| 5,585,640 A | 12/1996 | Huston et al. |
| 5,625,456 A | 4/1997 | Lawandy |
| 5,677,545 A | 10/1997 | Shi et al. |
| 5,747,180 A | 5/1998 | Miller et al. |
| 5,751,018 A | 5/1998 | Alivisatos et al. |
| 5,882,779 A | 3/1999 | Lawandy |
| 5,985,173 A | 11/1999 | Gray et al. |
| 5,985,353 A | 11/1999 | Lawton et al. |

(Continued)

FOREIGN PATENT DOCUMENTS

WO    WO 95/29473    11/1995

(Continued)

OTHER PUBLICATIONS

Aktsipetrov et al. "Generation of reflected second harmonic at semiconductor quantum dots," JETP Letters, vol. 55, No. 8, 435-439 (1992).

(Continued)

*Primary Examiner*—Cuong Q Nguyen
(74) *Attorney, Agent, or Firm*—Steptoe & Johnson LLP

(57) ABSTRACT

A semiconductor nanocrystal can have a barbell shape. The nanocrystal can include two semiconductor materials selected so that upon excitation, one charge carrier is substantially confined to the one semiconductor material and the other charge carrier is substantially confined to the other semiconductor material.

29 Claims, 5 Drawing Sheets

U.S. PATENT DOCUMENTS

| | | | |
|---|---|---|---|
| 5,990,479 | A | 11/1999 | Weiss et al. |
| 6,036,774 | A | 3/2000 | Lieber et al. |
| 6,114,038 | A | 9/2000 | Castro et al. |
| 6,139,585 | A | 10/2000 | Li |
| 6,207,229 | B1 | 3/2001 | Bawendi et al. |
| 6,225,198 | B1 | 5/2001 | Alivisatos et al. |
| 6,319,426 | B1 | 11/2001 | Bawendi et al. |
| 6,322,901 | B1 | 11/2001 | Bawendi et al. |
| 6,323,989 | B1 | 11/2001 | Jacobson et al. |
| 6,379,635 | B2 | 4/2002 | O'Brien et al. |
| 6,423,551 | B1 | 7/2002 | Weiss et al. |
| 6,444,143 | B2 | 9/2002 | Bawendi et al. |
| 6,447,698 | B1 | 9/2002 | Ihara et al. |
| 6,548,168 | B1 | 4/2003 | Mulvaney et al. |
| 6,548,171 | B1 | 4/2003 | Barbera-Guillem et al. |
| 6,592,842 | B2 | 7/2003 | Elder et al. |
| 6,788,453 | B2 | 9/2004 | Banin et al. |
| 6,819,692 | B2 | 11/2004 | Klimov et al. |
| 6,855,202 | B2 | 2/2005 | Alivisatos et al. |
| 6,861,155 | B2 | 3/2005 | Bawendi et al. |
| 6,872,330 | B2 | 3/2005 | Mack et al. |
| 6,875,274 | B2 | 4/2005 | Wong et al. |
| 6,878,871 | B2 | 4/2005 | Scher et al. |
| 7,060,243 | B2 | 6/2006 | Bawendi et al. |
| 2002/0066401 | A1 | 6/2002 | Peng et al. |
| 2003/0017264 | A1 | 1/2003 | Treadway et al. |
| 2003/0089899 | A1 | 5/2003 | Lieber et al. |
| 2004/0118448 | A1 | 6/2004 | Scher et al. |
| 2005/0109269 | A1 | 5/2005 | Alivisatos et al. |
| 2005/0126628 | A1 | 6/2005 | Scher et al. |
| 2005/0164432 | A1 | 7/2005 | Lieber et al. |
| 2005/0211154 | A1 | 9/2005 | Alivisatos et al. |
| 2005/0221072 | A1 | 10/2005 | Dubrow et al. |

FOREIGN PATENT DOCUMENTS

| | | |
|---|---|---|
| WO | WO 98/04740 | 2/1998 |
| WO | WO 98/19963 | 5/1998 |
| WO | WO 98/33070 | 7/1998 |
| WO | WO 98/36376 | 8/1998 |
| WO | WO 98/46372 | 10/1998 |

OTHER PUBLICATIONS

Alivisatos et al., "Organization of 'nanocrystal molecules' using DNA," Nature, 382:609-611, Aug. 15, 1996.

Alivisatos et al., "Semiconductor Clusters, Nanocrystals, and Quantum Dots," Science, 271:933-937, 1996.

Alivisatos, "Perspectives on the Physical Chemistry of Semiconductor Nanocrystals" J. Phys. Chem. 1996(100):13226-13239, 1996.

Baltrameyunas et al., "Fast switching of the transmission of light by glasses activated with CdS microcrystals," Sov. Phys. Semicond., vol. 25 No. 2, 164-166 (1991).

Baltramiejunas et al., "Rapid Processes of Darkening and Bleaching in CdS Doped Glasses," Superlattices and Microstructures vol. 10, No. 3, 307-310 (1990).

Bawendi et al., "Luminescence properties of CdSe quantum crystallites: resonance between interior and surface localized states," J. Chem. Phys., 96(2):946-954, 1992.

Beverloo et al., "Preparation and Microscopic Visualization of Multicolor Luminescent Immunophosphors," Cytometry, 13:561-570, 1992.

Bhargava et al., "Quantum Confined Atoms of Doped ZnO Nanocrystals", Phys. Stat. Sol (b) 229, No. 2, 897-901 (2002).

Bruchez et al., "Semiconductor Nanocrystals as Fluorescent Biological Labels" Science 281:2013-2016, Sep. 1998.

Bruchez et al., "Semiconductor nanocrystals as fluorescent probes for biology," Cytometry, Supplement 9, p. 26, Mar, 1998.

Bunge, S.D. et al., J. Mater. Chem. 2003, 13 1705-1709.

Cao, Y.W. and Banin, U., Angew. Chem. Int. Edit. 1999, 38, 3692.

Chamarro et al., "Enhancement of electron-hole exchange interaction in CdSe nanocrystals; A quantum confinement effect," Physical Review B, vol. 53, No. 3, Jan. 15, 1996-I, 1336-1342.

Chamarro et al., "Enhancement of Exciton Exchange Interaction by Quantum Confinement in CdSe Nanocrystals," Jpn. J. Appl. Phys, vol. 34, 12-14 (1994).

Chamarro et al., "Size-dependent Electron-Hole Exchange Interaction in CdSe Quantum Dots, Il Nuovo Cimento," vol. 17, Nos. 11-12, (1995) 1407-1412.

Chan et al., "Quantum Dot Bioconjugates for Ultrasensitive Nonisotopic Detection" Science 281:2016-2018, Sep. 1998.

Chepic et al., "Auger ionization of semiconductor quantum drops in a glass matrix," Jounal of Luminescence 47 (1990) 113-127 North-Holland.

Coffer et al., "Characterization of quantum-confined CdS Nanocrystallites stabilized by deoxyribonucleic acid (DNA)" Nanotechnology 3:69-76, 1992.

Colvin et al., "Light-emitting diodes made from cadmium selenide nanocrystals and a semiconducting polymer" Nature 370(6488):354-357, Aug. 4, 1994.

Correa-Duarte et al., "Stabilization of CdS semiconductor nanoparticles against photodegradation by silica coating procedure," Chem. Phys. Lett., 286:497-501, 1998.

Cumberland, S.L., et al., Chem. Mater. 2002, 14, 1576-1584.

Dabbousi et al., "Electroluminescence from CdSe quantum-dot/polymer composites" Appl. Phys. Lett. 66(11):1316-1318, Mar. 13, 1995.

Dabbousi, et al., "(CdSe)ZnS core-shell quantum dots: synthesis and characterization of a size series of highly luminescent nanocrystallites" J. of Phys. Chem. B 101(46):9463-9475, Nov. 13, 1997.

Danek et al., "Synthesis of Luminescent Thin-Film CdSe/ZnSe Quantum Dot Composites Using CdSe Quantum Dots Passivated with an Overlayer of ZnSe" Chem. Mater. 8(1):173-180, 1996.

De Oliveira et al. "Probing of the quantum dot size distribution in CdTe-doped glasses by photoluminescence excitation spectroscopy," Appl. Phys. Lett. 66:439-441 (1995).

De Paula et al. "Quantum confinement effects on the optical phonons of CdTe quantum dots," Superlattices and Microstructures 23:1103-1106 (1998).

Dneproviskii et al., "Time-Resolved Luminescence of CdSe Microcrystals," Solid State Communications, vol. 74, No. 7, pp. 555-557 (1990).

Edamatsu et al., "Subpicosecond dynamics of confined excitons and optical nonlinearities of CuCl quantum dots," Journal of Luminescence 66 & 67 (1996) 406-409.

Efros et al.. "Resonance Raman Spectroscopy of Electron-Hole Pairs—Polar Phonon Coupling in Semiconductor Quantum Microcrystals," Solid State Communications, vol. 78, No. 10, pp. 853-856 (1991).

Ekimov, et al., "Growth of CdSe nanocrystals in ion-implanted $SiO_2$ films," Journal of Crystal Growth 151 (1995) 38-45.

Ekimov et al., "Absorportion and intensity-dependent photoluminescence measurements on CdSe quantum dots: assignment of the first electronic transitions," Journal of the Optical Society of America, vol. 10, Nos. 1-12, 100-107 (1992).

Ekimov et al., "Dimensional Effects in Luminescence Spectra of Zero-Dimensional Semiconductor Structures," Bulletin of the Russian Academy of Sciences, vol. 56, No. 2, pp. 154-157 (Feb. 1992).

Ekimov et al., "Donor-like Exciton in Zero-Dimension Semiconductor Structures," Solid State Communications, vol. 69, No. 5, pp. 565-568 (1989).

Ekimov et al., "Influence of high hydrostatic pressures on the exciton spectrum of CdS microcrystals in glass," Sov. Phys. Semicond. 23(9), Sep. 1989, pp. 965-966.

Ekimov et al., "Nonlinear Optics of Semiconductor-Doped Glasses," Phys. Stat. Sol. (b) 150, (1988) pp. 627-633.

Ekimov et al., "Optics of Zero Dimensional Semiconductor Systems, Acta Physica Polonica A," vol. 79 (1991) No. 1. pp. 5-14.

Ekimov et al., "Photoluminescence of quasizero-dimensional semiconductor structures," Sov. Phys. Solid State 31(8), Aug. 1989, pp. 1385-1393.

Ekimov et al., "Quantization of the energy spectrum of holes in the adiabatic potential of the electron," JETP Lett., vol. 43, No. 6, Mar. 25, 1986, pp. 376-379.

Ekimov et al., "Quantum Size Effect in Semiconductor Microcrystals," Solid State Communications, vol. 56, No. 11, pp. 921-924 (1985).

Ekimov et al., "Quantum size effect in the optical spectra of semiconductor microcrystals," Sov. Phys. Semicond. 16(7), Jul. 1982, pp. 775-778.

Ekimov et al., "Quantum size effect in three-dimensional microscopic semiconductor crystals," JETP Lett, vol. 34, No. 6, Sep. 20, 1981, pp. 345-349.

Ekimov et al., "Quantum-Size Stark Effect in Semiconductor Microcrystals," Journal of Luminescence 46 (1990) 97-100 North-Holland.

Ekimov et al., "Size quantization of the electron energy spectrum in a microscopic semiconductor crystal," JETP Lett., vol. 40, No. 8, Oct. 25, 1984, pp. 1136-1139.

Ekimov et al., "Spectra and Decay Kinetics of Radiative Recombination in CdS Microcrystals," Journal of Luminescence 46 (1990) 83-95 North-Holland.

Ekimov, "Growth and optical properties of semiconductor nanocrystals in a glass matrix," Journal of Luminescence 70 (1996) 1-20.

Ekimov, "Optical Properties of Oxide Glasses Doped by Semiconductor Nanocrystals," Radiation Effects and Defects in Solids, 1995, vol. 134, pp. 11-22.

Ekimov, "Optical Properties of Semiconductor Quantum Dots in Glass Matrix," Physica Scripta. vol. T39, 217-222 (1991).

Empedocles et al, "Photoluminescence Spectroscopy of Single CdSe Nanocrystallite Quantum Dots" Phys. Rev. Lett. 77(18):3873-3876 (Oct. 1996).

Empedocles et al., "Quantum-Confined Stark Effect in Single CdSe Nanocrystallite Quantum Dots" Science 278:2114-2117 (Dec. 1997).

Gan et al., "Enhanced Photoluminescence and Characterization of Mn-Doped ZnS Nanocrystallites Synthesized in Microemulsion" Langmuir 1997(13):6427-6431 (1997).

Gao et al., "Strongly Photoluminescent CdTe Nanocrystals by Proper Surface Modification," J. Phys. Chem., 102:8360-8363 (1998).

Gopidas et al., "Photophysical and Photochemical Aspects of Coupled Semiconductors. Charge-Transfer Processes in Colloidal $CdS-TiO_2$ and CdS-AgI Systems," J. Phys Chem. 1990, 94, 6435-6440.

Grabovskis, et al., "Photoionization of semiconducting microcrystals in glass," Sov. Phys. Solid State 31(1), Jan. 1989, pp. 149-151.

Guha et al., "Hybrid organic-inorganic semiconductor-based light-emitting diodes" J. Appl. Phys. 82(8):4126-4128 (Oct. 15, 1997).

Gurevich et al. "Preparation and investigation of $SiO_2$ films activated by CdS semiconductor nanocrystals," Soviet Physics Semiconductors, vol. 26, 57-59 (1992).

Gurevich et al., "Growth of CdS nanocrystals in silicate glasses and in thin $SIO_2$ films in the Initial states of the phase separation of a solid solution," Semiconductors, 28 (5), May 1994, 486-493.

Hässelbarth et al., "Detection of shallow electron traps in quantum sized CdS by fluorescence quenching experiments," Chem. Phys. Lett. 1993, 203, 271-276.

Hässelbarth et al., "Chemistry and Photophysics of Mixed CdS/HgS Colloids," J. Phys. Chem. 1993, 97, 53330-5340.

Hatami et al., "Carrier dynamics in type-II GaSb/GaAs quantum dots", Physical Review B, vol. 57, No. 8, Feb. 1998, 4635-4641.

Haus, J.W., et al., Phys. Rev. B 1993, 47, 1359.

Hines et al., "Synthesis and Characterization of Strongly Luminescing ZnS-Capped CdSe Nanocrystals" J. Phys. Chem. 100:468-471 (Jan. 1996).

Itoh et al., "Interface effects on the properties of confined excitons in CuCl microcrystals," Journal of Luminescence 60 & 61 (1994) 396-399.

Itoh et al., "Polaron and Exciton-Phonon Complexes in CuCl Nanocrystals," Physical Review Letters, vol. 74, No. 9, Feb. 27, 1995, p. 1645-1648.

Itoh et al., "Subpicosecond dynamics of confined excitons in CuCl nanocrystals," Materials Science and Engineering A217/218 (1996) 167-170.

Jarvis et al., "Solution Synthesis and Photoluminescence Studies of Small Crystallites of Cadmium Telluride," Mat. Res. Soc. Symp. Proc., 272:229-234 (1992).

Jursenas et al., "Surface Recombination of Nonequilibrium Electron-Hole Plasma in Laser-Modified Semiconductor-Doped Glasses," Solid State Communications, vol. 87, No. 6, 577-580 (1993).

Kagan et al., "Electronic Energy Transfer in CdSe Quantum Dot Solids," Physical Review Letters, 76:1517-1520 (1996).

Kagan et al., "Long-range resonance transfer of electronic excitations in close-packed CdSe quantum-dot solids," Physical Review Letters, 54:8633-8643 (Sep. 15, 1996).

Kamat, P.V. "Photoinduced Charge Transfer between Fullerenes ($C_{60}$ and $C_{70}$) and Semiconductor ZnO Colloids," J. Am. Chem. Soc. 1991, 113, 9705-9707.

Kietzmann, R. et al. "Picosecond Time Resolved Electron Injection from Excited Cresyl Violet Monomers and $Cd_3P_2$ Quantum Dots into $TiO_2$," Mol. Cryst. Liq. Cryst. 1991, 194, 169-180.

Kortan et al., "Nucleation and Growth of CdSe on ZnS Quantum Crystallite Seeds, and Vice Versa, In Inverse Micelle Media" J. Am Chem. Soc. 112:1327-1332 (1990).

Kudera et al., "Selective Growth of PbSe on One or Both Tips of Colloidal Semiconductor Nanorods", Nano Lett. 5(3), 445-449 (2005).

Kuno et al., "The band edge luminescence of surface modified CdSe nanocrystallites: Probing the luminescing state" J. Chem. Phys. 106(23):9869-9882 (Jun. 1997).

Kuroda et al. "Micro photoluminescence spectra of CdTe and CdMnTe self-organized quantum dots," Journal of Luminescence 83-84:321-342 (1999).

Laheld, U.E.H., et al., Phys. Rev. B 1995, 52:2697.

Lawless et al., "Bifunctional Capping of CdS Nanoparticles and Bridging to TiO2" J. Phys. Chem. 99:10329-10335 (1995).

Lee et al., "Surface Derivatization of Nanocrystalline CdSe Semiconductors," Mat. Res. Soc. Symp. Proc., 452:323-328 (1997).

Liz-Marzan et al., "Synthesis of Nanosized Gold-Silica Core-Shell Particles" Langmuir 12:4329-4335 (1996).

Löher et al., "Epitaxy films of the 3D semiconductor CdS on the 2D layered substrate MX2 prepared by Van der Waals epitaxy" Journal of Crystal Growth, vol. 146, 1995, pp. 408-412.

Lublinskaya et al., "CdS nanocrystal growth in thin silica films: evolution of size distribution function", Journal of Crystal Growth 184/185 (1998) 360-364.

Mahtab et al., "Preferential-absorption of a 'kinked' DNA to a neutral curved surface: comparison to and implications for nonspecific DNA-protein interactions," J. Am. Chem. Soc., 118:7028-7032 (1996).

Mahtab et al., "Protein-sized quantum dot luminescence can distinguish between 'straight', 'bent', and 'kinked' oligonucleotides", Am. Chem. Soc., 117:9099-9100 (1995).

Matsumoto et al., "Preparation of Monodisperse CdS Nanocrystals by Size Selective Photocorrosion" J. Phys. Chem.100(32):13781-13785 (1996).

Mikulec et al., "Fluorescent semiconductor nanocrystallites derivatized with biomolecules" Amer. Chem.. Soc. Nat'l Meeting, Boston, MA (Aug. 24, 1998).

Mikulec et al., "Synthesis and Characterization of Highly Luminescent (CdSe)ZnS Quantum Dots," Materials Research Society Symposium, 452:359-364 (1997).

Mokari et al., "Selective Growth of Metal Tips onto Semiconductor Quantum Rods and Tetrapods", Science 304, 1787-1790 (2004).

Mokari et al., "Synthesis and Properties of CdSe/ZnS Core/Shell Nanorods", Institute of Chemistry, The Hebrew University of Jerusalem (2003).

Müllenborn et al., "Characterization of Solution-Synthesized CdTe and HgTe," Applied Physics, 56:317-321 (1993).

Mulvaney et al., "Surface Chemistry of Colloidal Gold: Deposition of Lead and Accompanying Optical Effects," J. Phys. Chem. 1992, 96, 10419-10424.

Murphy et al., "Quantum dots as inorganic DNA-binding proteins," Mat. Res. Soc. Symp., 452:597-600 (1997).

Murray et al., "Synthesis and Characterization of Nearly Monodisperse CdE (E=S, Se, Te) Semiconductor Nanocrystallites" J. Am. Chem. Soc. 115(19):8706-8715 (1993).

Nirmal et al., "Fluorescence Intermittency in single Cadmium Selenide Nanocrystals" Nature 383:802:-804 (Oct. 1996).

Pehnt et al., "Nanoparticle Precursor Route to Low-Temperature Spray Deposition of CdTe Thin Films," Appl. Phys. Lett., 67(15):2176-2178 (1995).

Peng et al., "Epitaxial Growth of Highly Luminescent CdSe/CdS Core/Shell Nanocrystals with Photostability and Electronic Accessibility," J. Am. Chem. Soc., 119:7019-7029 (1997).

Peng et al., "Synthesis and Isolation of a Homodimer of Cadmium Selenide Nanocrystals," Angewandte Chemie, 36:145-147 (1997).

Rajh et al., "Synthesis and Characterization of Surface-Modified Colloidal CdTe Quantum Dots" J. Phys. Chem. 97:11999-12003 (Nov. 1993).

Resch et al., "Photochemistry and Radiation Chemistry of Colloidal Semiconductors. 33. Chemical Changes and Fluorescence in CdTe and ZnTe," Langmuir 5:1015-1020 (1989).

Rockenberger et al. "An EXAFS Study on Thiolcapped CdTe Nanocrystals," Ber. Bunsenges. Phys. Chem. 102:1561-1564 (1998).

Rogach et al. "Synthesis, Morphology and Optical Properties of Thiol-Stabilized CdTe Nanoclusters in Aqueous Solution," Ber. Bunsenges. Phys. Chem. 101:1668-1670 (1997).

Rogach et al., "Synthesis and characterization of Thiol-Stabilized CdTe Nanocrystals" Ber. Bunsenges. Phys. Chem. 100(11):1772-2778 (1996).

Rorison, "A theory for excitons in type II quantum dot systems", Semicond. Sci. Technol. 8 (1993) 1470-1474.

Rorison, J.M., Phys. Rev. B 1993, 48:4643.

Saviot et al., "Effects of Resonance on Low-Frequency Raman Scattering From Semiconductor Nanocrystals," Radiation Effects and Defects in Solids, 1995, vol. 137, pp. 45-50.

Saviot et al., "Size dependence of acoustic and optical vibrational modes of CdSe nanocrystals in glasses," Journal of Non-Crystalline Solids 197 (1996) 238-246.

Saviot et al., "Size-selective resonant Raman scattering in CdS doped glasses," Physical Review B, vol. 57, No. 1, Jan. 1, 1998-I, 341-346.

Schittenhelm, P., et al., Appl. Phys. Lett. 1995, 67, 1292.

Schooss, D., et al., Phys. Rev. B 1994, 49, 49.

Sirenko et al., "Spin-flip and acoustic-phonon Raman scattering in CdS nanocrystals", Physical Review B, vol. 58, No. 4, 15 (Jul. 1998-II), 2077-2087.

Spanhel et al., "Photochemistry of Colloidal Semiconductors. Surface Modification and Stability of Strong Luminescing CdS Particles" J. Am. Chem. Soc. 109(19):5649-5655 (1987).

Spanhel, L., et al. "Photochemistry of Semiconductor Colloids. 22. Electron Injection from Illuminated CdS into Attached $TiO_2$ and ZnO Particles," J. Am. Chem. Soc. 1987, 109, 6632-6635.

Spanhel, L., et al. "Photochemistry of Semiconductor Colloids. 24. Interparticle Electron Transfer in $Cd_3P_2$-$TiO_2$ and $Cd_3P_2$-ZnO Sandwich Structures," Ber. Bunsenges. Phys. Chem. 1987, 91, 1359-1363.

Sungjee Kim et al., "Tye-II Quantum Dots: CDTE/CdSe(Core/Shell) and CdSe/ZnTe(core/Shell) Heterostructures". J. Am. Chem. Soc. 2003, 125, 11466-11467.

Steigerwald et al., "Surface Derivatization and Isolation of Semiconductor Cluster Molecules," J. Am. Chem. Soc., 110:3046-3050 (1988).

Suzuki, K., et al., J. Appl. Phys. 1999, 85, 8349.

Tamulaitis et al., "Dynamics of Nonlinear Optical Response of CuBr-Doped Glasses," Superlattices and Microstructures, vol. 3, No. 2, 199-202 (1993).

Tsuji et al., "Characterization of CdS thin film in high efficient CdS/CdTe solar cells", Journal of Crystal Growth, vol. 214/215, 2000, pp. 1142-1147.

Valenta et al., "Dynamics of excitons in CuBr nanocrystals: Spectral-hole burning and transient four-wave-mixing measurements," Physical Review B, vol. 57, No. 3, Jan. 15, 1998-I, 1774-1783.

Vandyshev et al., "Nonlinear optical properties of semiconductor microcrystals," JETP Lett., vol. 46, No. 10, Nov. 25, 1987 pp. 435-439.

Volkov et al., "Oscillations of polarization of recombination radiation of a variable gap semiconductor in a magnetic field," JETP Lett., vol. 25 No. 55, 526-528 (1977).

Weller, H. "Quantized Semiconductor Particles: A Novel State of Matter for Materials Science," Adv. Mater. 1993, 5, 88-95.

Whitesell et al., "Directionally Aligned Helical Peptides on Surfaces" Science 261:73-76 (Jul. 1993).

Yakimov, A.I., et al., Phys. Rev. B 2001, 63, 045312.

Yang, C.S., et al., Chem. Mater. 2002, 14, 1277-1284.

SEMICONDUCTOR NANOCRYSTAL HETEROSTRUCTURES

FEDERALLY SPONSORED RESEARCH OR DEVELOPMENT

This invention was made with government support under Grant Number DAAD19-02-D-0002 awarded by Army Research Office, and under Grant Number DMR-0213282 awarded by the National Science Foundation. The government has certain rights in the invention.

TECHNICAL FIELD

The invention relates to semiconductor nanocrystal heterostructures.

BACKGROUND

Nanocrystals having small dimensions can have properties intermediate between molecular and bulk forms of matter. For example, nanocrystals of semiconductor materials having sufficiently small dimensions can exhibit quantum confinement of excitons (excited state electron-hole pair) in all three dimensions. Quantum confinement leads to an increase in the effective band gap of the material with decreasing crystallite size. Consequently, both the optical absorption and emission of nanocrystals shift to the blue (i.e., to higher energies) as the size of the nanocrystal decreases.

The quantum efficiency of emission from nanocrystals having a core of a first semiconductor material can be enhanced by applying an overcoating of a second semiconductor material such that the conduction band of the second semiconductor material is of higher energy than that of the first semiconductor material, and the valence band of the second semiconductor material is of lower energy than that of the first semiconductor material. As a result, both charge carriers of an exciton, i.e., electrons and holes, are confined in the core of the nanocrystal.

SUMMARY OF THE INVENTION

In general, a semiconductor nanocrystal heterostructure has a first semiconductor material adjacent to a second semiconductor material. The first semiconductor material and second semiconductor material are selected so that, upon excitation, one carrier is substantially confined to the first material and the other carrier is substantially confined to the second material. In one example, the conduction band of the first semiconductor material is at higher energy than the conduction band of the second semiconductor material and the valence band of the first semiconductor material is at higher energy than the valence band of the second semiconductor material. In another example, the conduction band of the first semiconductor material is at lower energy than the conduction band of the second semiconductor material and the valence band of the first semiconductor material is at lower energy than the valence band of the second semiconductor material. These band alignments make spatial separation of carriers, i.e. the hole and the electron, energetically favorable upon excitation. These structures are type II heterostructures. In contrast, in a type I heterostructure the conduction band of the second semiconductor material is of higher energy than that of the first semiconductor material, and the valence band of the second semiconductor material is of lower energy than that of the first semiconductor material. Type I heterostructure nanocrystals favor confinement of both the hole and the electron in the first semiconductor material.

Nanocrystals having type II heterostructures have advantageous properties that result of the spatial separation of carriers. In some nanocrystals having type II heterostructures the effective band gap, as measured by the difference in the energy of emission and energy of the lowest absorption features, can be smaller than the band gap of either of the two semiconductors making up the structure. By selecting particular first semiconductor materials and second semiconductor materials, nanocrystal shapes and dimensions (such as core diameter and overcoating thickness for core/shell nanocrystals), nanocrystals having type II heterostructures can have emission wavelengths, such as infrared wavelengths, that are otherwise unavailable with a given semiconductor material in other structures. In addition, the spatial separation of charges in the lowest excited states of nanocrystals having type II heterostructures can make these materials more efficient in photovoltaic or photoconduction devices where the nanocrystals are chromophores and one of the carriers needs to be transported away from the excitation site prior to recombination.

Advantageously, a wide variety of nanocrystals having type II heterostructures can be prepared using colloidal synthesis. Colloidal synthesis allows nanocrystals to be prepared with controllable dispersibility imparted from coordinating agents. The nanocrystal can have a barbell shape which can pack densely in a film compared to other nanocrystal shapes, and does not enclose charge carriers inside a shell.

In one aspect, a semiconductor nanocrystal includes a central region and a first end, the central region including a first semiconductor material, and a distal region at the first end of the rod, the distal region including a second semiconductor material. The first semiconductor material and the second semiconductor material are selected so that, upon excitation, one charge carrier is substantially confined to the central region and the other charge carrier is substantially confined to the distal region.

The nanocrystal can include a second distal region at a second end of the central region. The central region can be rod-shaped. The distal regions can each be approximately spherical, or rod-shaped. The nanocrystal can have a length ratio of, of between 0.1 and 0.5, or of between 0.2 and 0.9. The nanocrystal can have a radius ratio of between 0.1 and 10, or of between 0.3 and 3.5.

The first semiconductor material can be a Group II-VI compound, a Group II-V compound, a Group III-VI compound, a Group III-V compound, a Group IV-VI compound, a Group I-III-VI compound, a Group II-IV-VI compound, or a Group II-IV-V compound. The first semiconductor material can be ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or a mixture thereof.

The second semiconductor material can be a Group II-VI compound, a Group II-V compound, a Group III-VI compound, a Group III-V compound, a Group IV-VI compound, a Group I-III-VI compound, a Group II-IV-VI compound, or a Group II-IV-V compound. The second semiconductor material can be ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or a mixture thereof.

In another aspect, a method of making a nanocrystal includes forming a semiconductor nanocrystal having a central region and a first end, the central region including a first semiconductor material, and contacting the semiconductor nanocrystal with an M donor and an X donor at a temperature sufficient to cap the first end with a second semiconductor material, thereby forming a capped semiconductor nanocrystal having a central region including the first semiconductor material and a distal region including the second semiconductor material. The first semiconductor material and the second semiconductor material are selected so that, upon excitation, one charge carrier is substantially confined to the central region and the other charge carrier is substantially confined to the distal region.

The method can include contacting the semiconductor nanocrystal with an etching agent before contacting the semiconductor nanocrystal with the M donor and the X donor. Contacting the semiconductor nanocrystal with an M donor and an X donor at a temperature sufficient to cap the first end with a second semiconductor material can also be sufficient to cap the second end with the second semiconductor material.

The method can include selecting a coordinating solvent and a temperature to influence a shape of a distal region. The coordinating solvent and the temperature can be selected to form an approximately spherical distal region.

In another aspect, a photovoltaic device includes a first electrode, a second electrode, a voltage source configured to apply a voltage across the first electrode and the second electrode, and an active layer in electrical communication with the first electrode and the second electrode. The active layer includes a population of semiconductor nanocrystals. Each semiconductor nanocrystal of the population has a central region and a first end, the central region including a first semiconductor material, and a distal region at the first end of the rod, the distal region including a second semiconductor material. The first semiconductor material and the second semiconductor material are selected so that, upon excitation, one charge carrier is substantially confined to the central region and the other charge carrier is substantially confined to the distal region.

In the device, the population of semiconductor nanocrystals can substantially aligned. The first electrode and the second electrode can be parallel. The population of semiconductor nanocrystals can be substantially aligned with an alignment direction substantially perpendicular to the first electrode and the second electrode.

Other features, objects, and advantages of the invention will be apparent from the description and drawings, and from the claims.

DETAILED DESCRIPTION

Colloidal synthesis of nanocrystals can be used to manufacture nanocrystals that have type II heterostructures. Colloidal synthesis is described, for example, in Murray, C. B., et al., J. Am. Chem. Soc. 1993, 115, 8706, Peng, X., et al., J. Am. Chem. Soc. 1997, 119, 7019, Dabbousi, B. O., et al., J. Phys. Chem. B 1997, 101, 9463, and Cao, Y. W. and Banin, U., Angew. Chem. Int. Edit. 1999, 38, 3692, each of which is incorporated by reference in its entirety. The colloidal synthetic route can be applied to any II-VI and III-V semiconductor materials. Colloidal synthesis as applied to type II heterostructure semiconductor nanocrystals is described in U.S. Patent Application Publication No. 2004/0110002, which is incorporated by reference in its entirety.

Upon excitation of a nanocrystal having a type II heterostructure, the carriers are not confined in one semiconductor material. A nanocrystal having a type II heterostructure includes a first semiconductor material adjacent to a second semiconductor material. One carrier can become confined to the first semiconductor material, while the other is mostly confined to the second semiconductor material. The relative location of the carriers can depend on the materials in the core and the shell. The band offsets of the two semiconductor materials can make spatial separation of the hole and the electron energetically favorable. See, e.g., U.S. Patent Application Publication No. 2004/0110002, which is incorporated by reference in its entirety. Nanocrystals having type II heterostructures can have advantageous properties because of the spatial separation of carriers, which does not occur in nanocrystals having type I heterostructures. For example, nanocrystals having type II structures can access emission wavelengths (i.e. wavelengths of maximum emission intensity) that would not otherwise be available with the semiconductors making up the nanocrystal.

Figure 1A:
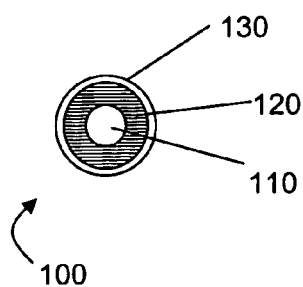
FIGS. 1A-1C are schematic depictions of nanocrystals.
Figure 1B:
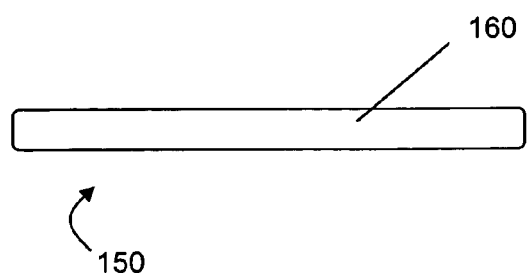
Figure 1C:
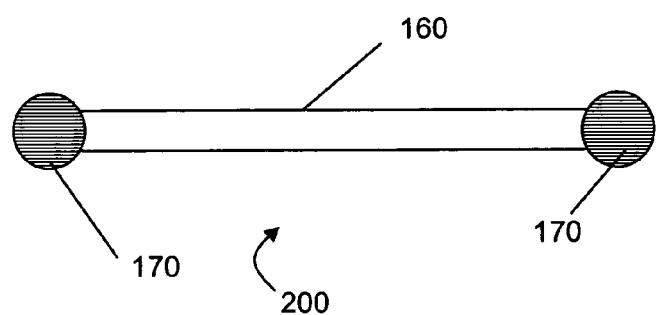
Figure 1C:
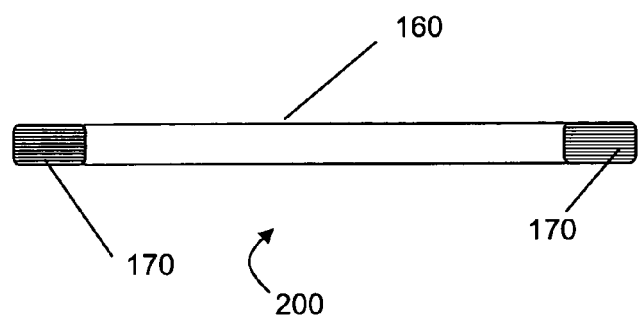

A semiconductor nanocrystal can have an approximately spherical shape, as illustrated (in cross-section) in FIG. 1A. Semiconductor nanocrystal 100 includes core 110 of a first semiconductor material. Core 110 is optionally overcoated by a second semiconductor material 120. Ligand layer 130 includes organic compounds with affinity for a semiconductor nanocrystal surface. The organic compounds can be selected for desired properties, such as solubility in a desired solvent or a desired reactivity. FIG. 1B depicts a side view of a rod-shaped semiconductor nanocrystal 150. Semiconductor nanocrystal 150 includes first semiconductor material 160. For simplicity, the ligand layer on semiconductor nanocrystal 150 has been omitted from FIG. 1B. FIG. 1C depicts barbell-shaped semiconductor nanocrystal 200. Barbell-shaped semiconductor nanocrystals can also be described as dumbbell-shaped, or as nanobarbells or nanodumbbells Nanocrystal 200 includes a central region 160 including first semiconductor material, and distal regions 170 including a second semiconductor material. Nanocrystal 200 can be prepared by adding a second semiconductor material to the ends of rod-shaped nanocrystal 150. FIG. 1C is a schematic depiction of nanocrystals with two substantially similar distal regions at each end of a rod-shaped central region. Alternatively, nanocrystals can be prepared where only one end of a rod-shaped nanocrystal is modified with a second semiconductor material. Distal regions 170 can be approximately spherical ("dots") or approximately rod-shaped as shown in FIG. 1C. Nanocrystal 200 can be referred as barbell shaped whether the distal regions are approximately spherical or rod-shaped. If distal regions 170 are rod-shaped, distal regions 170 can have approximately the same diameter as the central region. In either case, a nanocrystal having a central region and a distal region (or regions) can be described by a length ratio. The length ratio can be defined as the length of the central region divided by the total length of the nanocrystal. When referring to a population of nanocrystals, a length ratio can be an aggregate length ratio for the population (e.g., a mean length ratio, median length ratio, or rms length ratio for the population). The central region can have length in the range of 3 nm to 100 nm (such as between 5 nm and 40 nm), and the distal region can have a radius in the range of 1 nm to 10 nm (such as between 1.5 nm and 5 nm). Accordingly, the nanocrystal can have a length ratio in the range of 0.1 to 0.95 (such as between 0.2 and 0.9).

A nanocrystal having a central region and a distal region (or regions) can be described by a radius ratio. The radius ratio can be defined as the ratio of the radius of the distal region to the radius of the central region. The central region can have a radius in the range of 1 nm to 7 nm (such as between 1.5 nm and 5 nm), and the distal regions can have a radius in the range of 1 nm to 10 nm (such as between 1.5 nm and 5 nm). Accordingly, a barbell-shaped nanocrystal can have a radius ratio in the range of 0.1 to 10 (such as between 0.3 and 3.5). In some embodiments the radius ratio can be about 1. In other embodiments it can be substantially different than about 1, such as, for example, between 0.1 and 0.95 or between 1.05 and 10.

Spatial separation of the carriers in type II nanocrystals suggests poor overlap between the electron and hole wavefunctions. As a result, the quantum efficiency of photoluminescence can be lower for type II nanocrystals than for type I nanocrystals. See, e.g., U.S. Patent Application Publication No. 2004/0110002, which is incorporated by reference in its entirety. The emission from nanocrystals having type II structures originates from the radiative recombination of the carriers across the interface of the different semiconductor materials. Therefore, the energy of the emission depends on the band offsets, which are controlled by the semiconductor materials and sizes (e.g., for core/shell nanocrystals, the core diameter and shell thickness). Type II nanocrystals can have a smaller effective bandgap, and therefore emit at longer wavelengths, than nanocrystals composed of either the core or shell material in the type II nanocrystal. The nanocrystals having type II structures can be considered to have quasi-indirect, or virtual, bandgaps whose energies are determined by the band offsets. The effective bandgap can be engineered in such structures, since many possible combinations of semiconductor materials can be used to tailor the virtual bandgaps.

Quantum efficiency in nanocrystals having type II structures can be increased by adding additional semiconductor materials to the nanocrystals. For example, a second coating of ZnTe can be added to a CdTe/CdSe (core/shell) nanocrystal to increase the quantum efficiency to as high as 20%. The overcoating procedure can be similar to the CdSe/ZnTe (core/shell) nanocrystal shell preparation. The enhanced quantum efficiency is thought to originate from the increased carrier wavefunction overlap induced by the mismatched bandgaps. For increased quantum efficiency, it can be important for the first coating and second coating to have a mismatched band offset. For example, when a second coating of ZnS was deposited on CdTe/CdSe (core/shell) nanocrystals, the emission was red-shifted, but the quantum efficiency decreased. Although ZnS layers can help passivate the CdSe shell layer surface, the effect was overwhelmed by the decreased wavefunction overlaps due to the electron wavefunction leakage into the ZnS layers.

The nanocrystal can be a member of a population of nanocrystals having a narrow size distribution. The nanocrystal can be a sphere, rod, disk, or other shape. The nanocrystal can include a first semiconductor material. The nanocrystal can include a first semiconductor material having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. The first semiconductor material can include a Group II-VI compound, a Group II-V compound, a Group III-VI compound, a Group III-V compound, a Group IV-VI compound, a Group I-III-VI compound, a Group II-IV-VI compound, a Group II-IV-V compound, or mixtures thereof. For example, the first semiconductor material can include for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

The nanocrystal can include a second semiconductor material. The second semiconductor material can a composition different from the composition of the first semiconductor material. The first and second semiconductor materials can be selected to provide a desired band structure, such as a type I or a type II heterostructure. The second semiconductor material can be adjacent to the first semiconductor material, such that a junction is formed. The junction can be abrupt or graded. In a graded junction, the first material blends with the second material in the junction, providing a graded change in material. In contrast, in an abrupt junction there is little or substantially no blending of the materials.

The junction between two semiconductor materials can have different configurations depending on the shape of the nanocrystal. For example, a spherical nanocrystal can have a spherical core of a first semiconductor material coated with a shell of a second semiconductor material. A rod shaped nanocrystal can a rod of a first semiconductor material and a second semiconductor material. The second semiconductor material can coat the length and ends of the rods substantially evenly. Alternatively, the length and ends of the rod can be coated to different degrees. In particular the ends of the rod can coated to a greater degree than the length of the rod. The ends of the rod each can be coated by an approximately spherical region of a second semiconductor material. In this case, the nanocrystal can have a barbell shape.

The second semiconductor material of the nanocrystal can include a Group II-VI compound, a Group II-V compound, a Group III-VI compound, a Group III-V compound, a Group IV-VI compound, a Group I-III-VI compound, a Group II-IV-VI compound, a Group II-IV-V compound, or mixtures thereof. For example, the second semiconductor material can include ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region.

The population of nanocrystals can have a narrow size distribution. The population can be monodisperse and can exhibit less than a 15% rms deviation in size of the nanocrystals, preferably less than 10%, more preferably less than 5%. Spectral emissions in a narrow range of between 10 and 150 nm full width at half max (FWHM) can be observed (in other words, FWHM of less than 0.05 eV, or of less than 0.03 eV). Semiconductor nanocrystals having type II structures can have emission quantum efficiencies of greater than 2%, 5%, 10%, 20%, 40%, 60%, 70%, or 80%.

The absorption spectra of nanocrystals having type II heterostructures can feature smoothly increasing absorptions to the shorter wavelength region and long tails to the longer wavelength regions. The precise shape of the spectra can depend on the semiconductor materials in the nanocrystal, their geometry (e.g., spherical core/shell or barbell) and the amounts of each material. Nanocrystals having type II structures can have indirect band characteristics with spatially indirect excitons. Nanocrystals having type II structures can have relatively weak oscillator strength since the oscillator strengths are strongly governed by the carrier wavefunction overlaps. See, for example, Laheld, U. E. H., et al., *Phys. Rev. B* 1995, 52:2697, and Rorrison, J. M., *Phys. Rev. B* 1993, 48:4643, each of which is incorporated by reference in its entirety.

Nanocrystals that promote spatial separation of excited state charge carriers can be advantageous in photovoltaic devices. The spatial separation can allow a lower applied voltage to separate charge carriers in the device. Previous studies have produced type II structures such as spherical CdTe/CdSe core/shell nanocrystals and CdSe tetrapods having CdTe branches. See, e.g., Kim, S. et al., *J. Am. Chem. Soc.* 2003, 125, 11466-11467, U.S. Patent Application No. 2004/0110002, and Milliron, D. et al., *Nature* 2004, 430,190-195, each of which is incorporated by reference in its entirety. However, spherical core/shell and tetrapodal type II heterostructures have disadvantages with regards to use in a photovoltaic device, even though these structures spatially separate the exciton within the nanocrystal. In each case, the charge carriers cannot easily move towards the electrodes in order to generate sizeable currents: tetrapods cannot pack tightly, and therefore leave empty space when deposited into a film, and core/shell particles trap one of the carriers in the core.

Unlike other type II heterostructure nanocrystals, type II nanobarbells spatially separate exciton charge carriers, and the rod-like nanocrystals can pack tightly into a film. Tightly packed nanocrystals increase the number of photons which can be absorbed by a film and reduce the tunnel barrier for charge tunneling from one nanocrystal to the next, facilitating charge movement from the site of exciton generation to the electrodes of a photovoltaic device.

Charge transport in nanocrystal films is generally limited by a carrier tunneling mechanism (see, for example, Drndic, M., et al., *Journal of Applied Physics*, 2002, 92, 7498-7503; Jarosz, M. V., et al., *Physical Review B*, 2004, 70, 195327; and Leatherdale, C. A., et al., *Physical Review B* 2000, 62, 2669-2680, each of which is incorporated by reference in its entirety). Consequently, obtaining good conductivity and high photocurrent requires minimizing the distance between adjacent particles, such as by forming close-packed films. The desirability of close-packed films illustrates the need for well formed, monodisperse rodlike nanocrystals.

The method of manufacturing a nanocrystal is a colloidal growth process and can produce a monodisperse particle population. Colloidal growth occurs by rapidly injecting an M donor and an X donor into a hot coordinating agent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. Preparation and manipulation of nanocrystals are described, for example, in U.S. Pat. No. 6,322,901, which is incorporated by reference in its entirety.

The nanocrystal is a member of a population of nanocrystals. As a result of the discrete nucleation and controlled growth, the population of nanocrystals obtained has a narrow, monodisperse distribution of sizes. The process of controlled growth and annealing of the nanocrystals in the coordinating agent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. The inorganic compound can be a salt. The salt can be combined with a coordinating agent, such as an amine. See, for example, U.S. Pat. No. 6,576,291, which is incorporated by reference in its entirety. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide ($(TMS)_2Se$), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ($(TMS)_2Te$), bis(trimethylsilyl)sulfide ($(TMS)_2S$), a trialkyl phosphine sulfide such as (tri-n-octylphosphine) sulfide (TOPS), an ammonium salt such as an ammonium halide (e.g., $NH_4Cl$), tris(trimethylsilyl) phosphide ($(TMS)_3P$), tris(trimethylsilyl) arsenide ($(TMS)_3As$), or tris(trimethylsilyl) antimonide ($(TMS)_3Sb$). In certain embodiments, the M donor and the X donor can be moieties within the same molecule.

A coordinating agent can help control the growth of the nanocrystal. The coordinating agent is a compound having a donor lone pair that, for example, has a lone electron pair available to coordinate to a surface of the growing nanocrystal. The coordinating agent can be a solvent. Solvent coordination can stabilize the growing nanocrystal. Typical coordinating agents include alkyl phosphines, alkyl phosphine oxides, alkyl phosphonic acids, or alkyl phosphinic acids, however, other coordinating agents, such as pyridines, furans, and amines may also be suitable for the nanocrystal production. Examples of suitable coordinating agents include pyridine, tri-n-octyl phosphine (TOP) and tri-n-octyl phosphine oxide (TOPO). Technical grade TOPO can be used.

Nanocrystal shape can be determined by synthesis conditions, notably by the coordinating solvent(s) present during nanocrystal synthesis. The nanocrystal can be a sphere, rod, disk, or other shape. See, e.g., U.S. Pat. Nos. 6,225,198; 6,306,736; and 6,855,202, each of which is incorporated by reference in its entirety. Nanocrystal shape can be further controlled by the conditions under which a second semiconductor material is added to the nanocrystal.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average size, a population having a desired average nanocrystal size can be obtained. For example, a population of rod-shaped nanocrystals can have an average length of between 3 nm and 100 nm, such as between 5 nm and 40 nm. The population can have an average radius of between 1 nm and 10 nm, such as between 1.5 nm and 5 nm.

The particle size distribution can be further refined by size selective precipitation with a poor solvent for the nanocrystals, such as methanol/butanol as described in U.S. Pat. No. 6,322,901, incorporated herein by reference in its entirety. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean size, preferably 10% rms deviation or less, and more preferably 5% rms deviation or less.

The outer surface of the nanocrystal can include a layer of compounds derived from the coordinating agent used during the growth process. The surface can be modified by repeated exposure to an excess of a competing coordinating group to form an overlayer. For example, a dispersion of the nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal.

A cap including a second semiconductor material can be added to the nanocrystal. An capping process is described, for example, in U.S. Pat. No. 6,322,901, which is incorporated by reference in its entirety. By adjusting the temperature of the reaction mixture during capping and monitoring the absorption spectrum of the core, capped materials having high emission quantum efficiencies and narrow size distributions can be obtained. The shape of the cap can depend on the shape of the initial nanocrystal and the capping conditions used. For example, a cap grown on an approximately spherical nanocrystal can also be approximately spherical. In this case, the cap can substantially coat the spherical nanocrystal. If the initial nanocrystal is rod-shaped, the cap can be grown primarily on the ends of the rod and very little of the second semiconductor material added along the axis of the rod. A rod-shaped nanocrystal can be capped with a rod-shaped cap, or with an approximately spherical cap. Capping conditions, such as solvent composition and temperature, can determine the shape of the cap. For example, when caps are added under conditions that favor rod-shaped growth, rod-shaped caps can be formed; in contrast, approximately spherical caps are formed when the capping conditions favor approximately spherical growth.

It can be advantageous to purify semiconductor nanocrystals before a second semiconductor material is added to the nanocrystal. As discussed above, the nanocrystals can be purified by size-selective precipitation. After purification the nanocrystals can be treated with an etching agent. The etching agent can reduce the number of defect sites on the nanocrystals. Defect sites can act as undesired nucleation sites during addition of a second semiconductor nanocrystal. In making barbell-shaped nanocrystals, nucleation is desired at the ends of rods, but defect sites can cause nucleation along the length of a rod. Because the etching agent reduces the number of defect sites, the resulting barbells will have fewer worts along the length of the rods than barbells prepared without a prior etching treatment. The etching agent can be an amine, such as a primary amine, e.g., octylamine. An etching agent can be included during addition of a second semiconductor material to a nanocrystal.

Two-pot synthesis of barbell-shaped nanocrystals can improve (compared to one-pot synthesis) the quality of the heterojunction by minimizing contamination of the dot material with rod material. Adding the dots at temperatures normally used for core growth (rather than nucleation) can reduce overcoating of the rod (e.g., along the length of the rod) by the second semiconductor material.

Transmission electron microscopy (TEM) can provide information about the size, shape, and distribution of the nanocrystal population. Powder X-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/V is absorption spectrum.

EXAMPLES

CdSe rods were synthesized by heating cadmium oxide (CdO), octadecylphosphonic acid (ODPA) and trioctylphosphine oxide (TOPO) to 300° C. until solution is clear, heating to 320° C. and injecting a solution of toluene, trioctylphosphine (TOP) and trioctylphosphine selenide (TOP-Se), and growing the rods at 260° C. for fifteen minutes, as adapted from previously reported methods. See, for example, Peng, Z. et al., *J. Am. Chem. Soc.*, 2002, 124, 3343-3353; and Peng, Z., et al., *J. Am. Chem. Soc.*, 2001, 123, 1389-1395, each of which is incorporated by reference in its entirety. The rods were then precipitated from solution twice by adding methanol/butanol, centrifuging the solution at 3900 RPM and redispersing in hexane. After the second precipitation rods were redispersed in hexane with a few drops of octylamine and allowed to sit for several days until a significant increase in quantum yield occurred. Rods were then precipitated as above, redispersed in hexane and filtered.

To create CdSe/CdTe nanobarbells, a pot of TOPO, hexadecylamine (HDA) and hexylphosphonic acid (HPA) were degassed at 140° C. then cooled to 80° C., at which time rods dispersed in hexane are added to the pot, and the hexane pulled off under vacuum. Meanwhile a solution of cadmium 2,4-pentadionate, 1,2-hexadecanediol, and TOP was degassed at 110° C. in a separate flask. After degassing the solution was cooled and trioctylphosphine telluride (TOP-Te) was added to the flask, the contents of which were transferred to the addition funnel and added to the pot at 260° C. dropwise. Except for the presence of the CdSe rods, these conditions were identical to those used for preparation of CdTe dots. See, for example, Snee, P. T. et al., *Advanced Materials*, 2005, 17, 1131-1136, which is incorporated by reference in its entirety. The total reaction time after the start of the addition of the precursor solution did not exceed 15 minutes after which the resulting solution was cooled to room temperature and transferred under argon to a nitrogen glovebox to avoid oxidization of the CdTe tips. The CdSe/CdTe nanobarbells were then precipitated by the addition of toluene, and sonicated (although insoluble) in hexane from which they were once again precipitated. These steps extracted any CdTe dots formed during the synthesis from the solid CdSe/CdTe nanobarbells. After this CdSe/CdTe nanobarbells can be redispersed in chloroform and precipitated several times using methanol in order to remove any excess organic material from the solution. The CdSe/CdTe nanobarbells appeared to be light sensitive and remained dispersed in solution for several days only if stored under nitrogen in the dark.

As expected for such a heterostructure, the nanobarbells exhibited absorption spectra typical to a type II structure, with large apparent molar absorptivity across the visible spectrum. See, for example, Kim, S. et al., *J Am. Chem. Soc.* 2003, 125, 11466-11467, which is incorporated by reference in its entirety. The hole should be trapped in the valence band of the CdTe tips, and the electron in the conduction band of the CdSe. There was no emission, unlike in core/shell type II heterostructures. This was not unreasonable since the carriers are spatially well separated and the barbell was not capped with a higher band gap material (such as ZnS). Recombination was thus likely to occur primarily through non-radiative pathways involving trap states along the surface and so the heterostructure appeared non-emissive.

Figure 2:
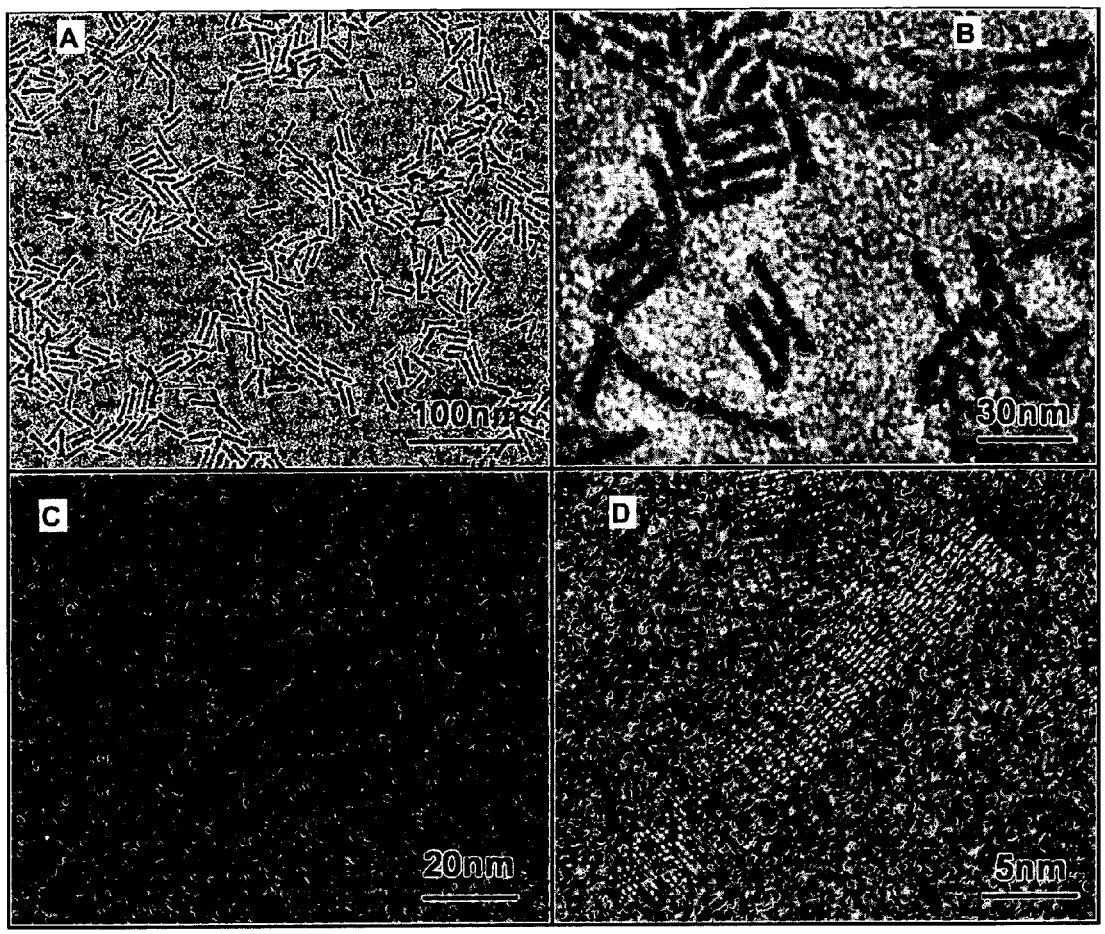
FIGS. 2A-2D are transmission electron microscope images of semiconductor nanocrystals.
Figure 3:
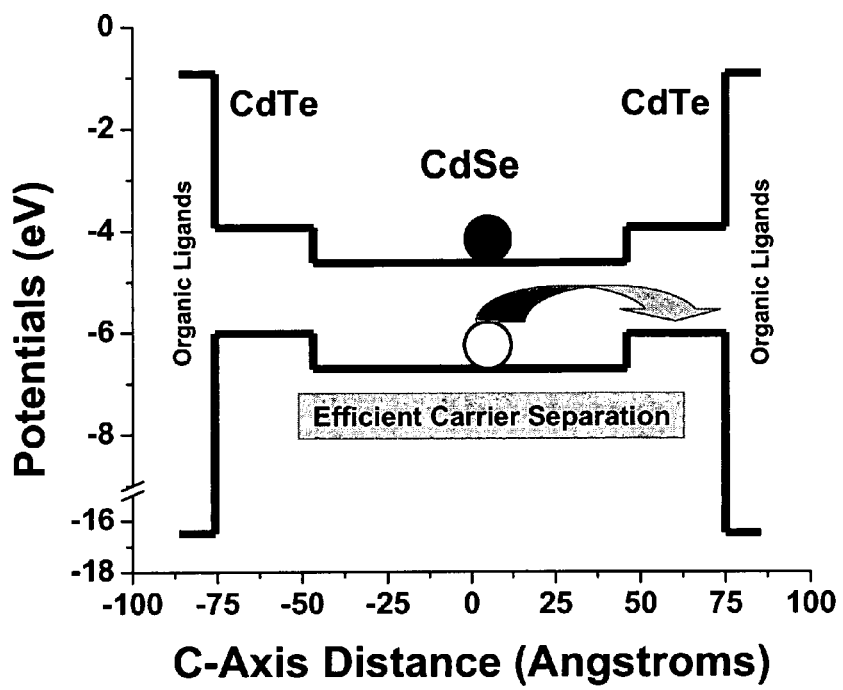
FIG. 3 is a schematic graph depicting band gap structure of a semiconductor nanocrystal.

FIG. 2 show TEM images of multiple nanobarbells, showing both monodisperse formation of the rod and growth of the CdTe dots on either end. Unlike previous preparations, CdTe dots grow symmetrically on either end without branching or other deviations that may increase excluded "empty" volume in a film. Nanobarbells synthesized in this manner are presumed to show packing properties similar to CdSe rods. See, e.g., Liang-shi Li, et al. *Advanced Materials* 2003, 15, 408-411, which is incorporated by reference in its entirety. In other words, the nanocrystals can become substantially aligned in a film. The direction of alignment can be perpendicular to the length of the rod. When the film is arranged on a substrate, the nanorods can be aligned so that the lengths of the rods are substantially perpendicular to the substrate. Preferably, when arranged on a substrate, aligned substantially perpendicular to the substrate and are close-packed in the lateral dimensions along the substrate.

Transmission electron microscope images were taken on a JEOL 200 TEM and expanded (FIGS. 2A-2B) and JEOL 2010 HR-TEM (FIGS. 2C-2D) showing CdSe/CdTe nanobarbells. High resolution images show that the c-axis of the wurtzite CdTe dots are not always oriented along the c-axis of the rod onto which they have grown, and that zinc blende defect planes often demarcate the heterojunction between the dot and rod.

Figures 4A, 4B:
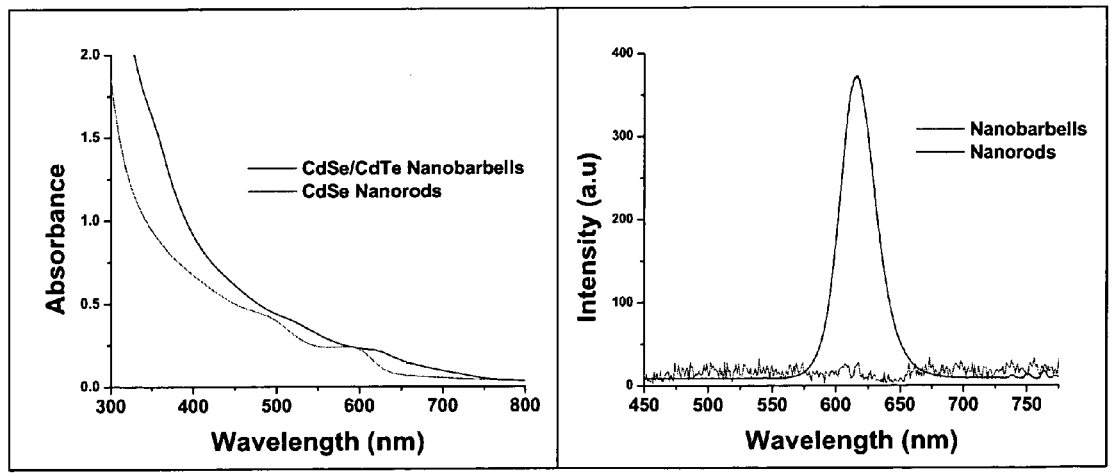
FIGS. 4A-4B are graphs depicting optical properties of semiconductor nanocrystals.
Figure 5A:
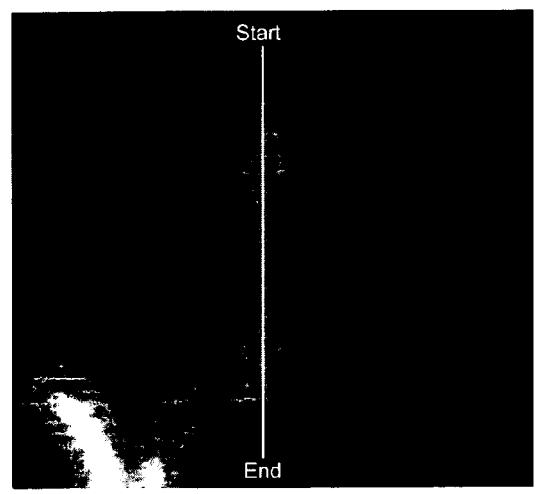
FIG. 5A is a STEM image of a semiconductor nanocrystal.
Figure 5B:
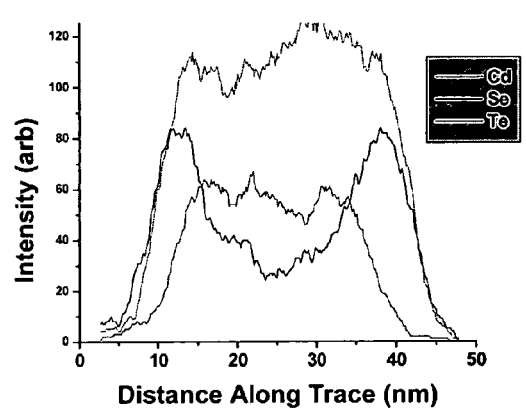
FIGS. 5B-5C are graphs depicting electron energy loss data measurements on the semiconductor nanocrystal.
Figure 5C:
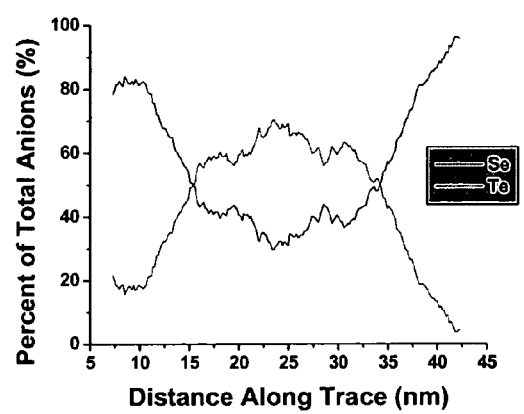
Figure 6:
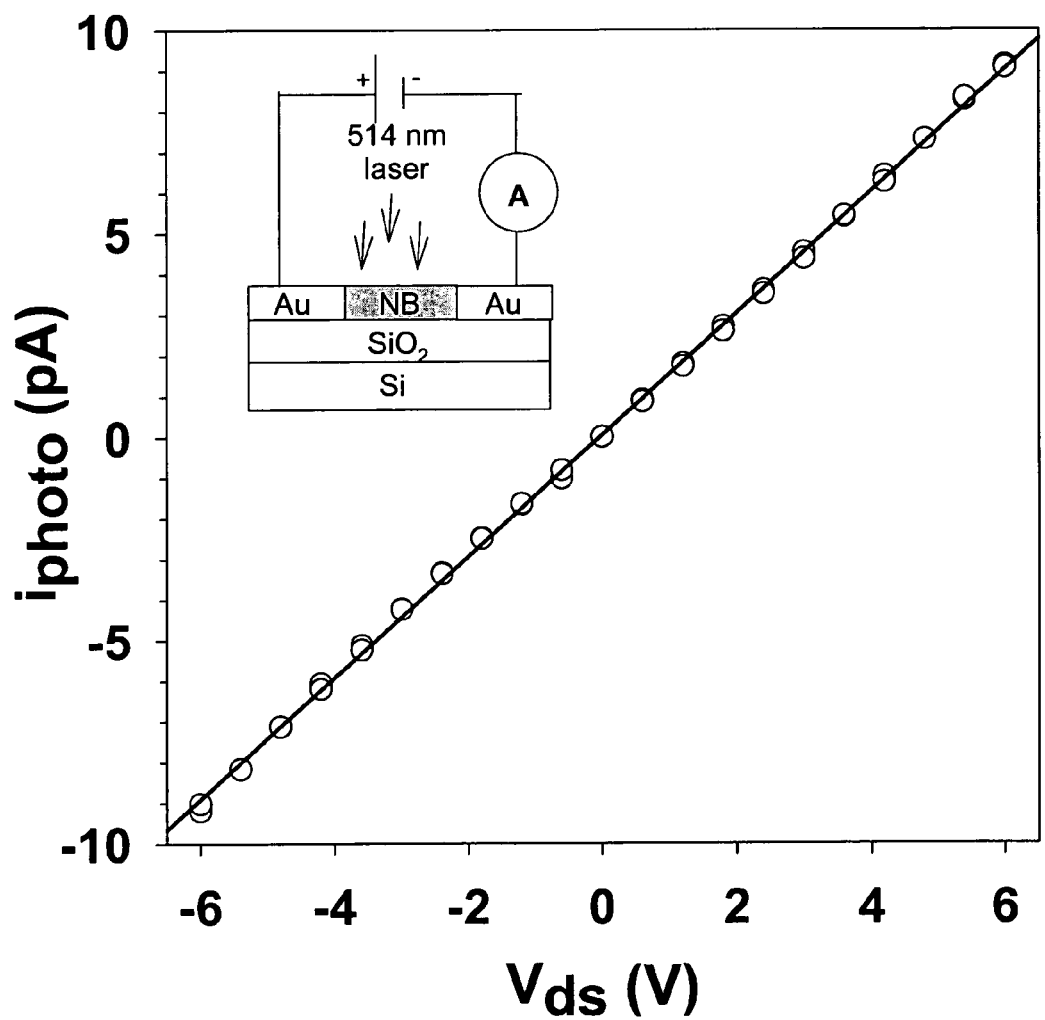
FIG. 6 is a graph depicting electrical measurements on semiconductor nanocrystals.

STEM measurements presented in FIG. 4 revealed an abrupt junction between the CdSe rod and the CdTe dots. FIG. 4A shows a STEM image of a single nanobarbell. The line labeled 'start-end' indicates where electron energy loss data illustrated in FIGS. 4B and 4C were recorded. Cd, Se and Te counts were collected at intervals of 1.7 Å and continuously averaged over ~5 nm to approach the expected diameter of the electron probe. In FIG. 4B, intensity (which was related to concentration) is plotted for all three elements. The relative intensities of Se and Te is displayed in FIG. 4C. Although accuracy of the instrument limited the ability to distinguish closely between the rod and dot sections of the nanobarbell, spots measured in the center of the rod indicate a concentration of less than 30% CdTe. This concentration corresponded to a CdTe thickness of about two monolayers around a rod with radius ~3 nm. However, the thickness of CdTe on the rod was likely thinner, because the closeness of the Cd and Te peaks in the X-ray spectrum can lead to overcounting of tellurium. Moreover, no discernable shell can be seen in the HR-TEM images (see FIG. 2D).

In a previous study of photoconductivity in CdSe nanocrystal films, one hundred percent exciton separation was observed after soaking the film in a dilute solution of butylamine. See, for example, Jarosz, M. V., et al., *Physical Review B* 2004, 70, 195327, which is incorporated by reference in its entirety. The butylamine partially exchanged with the TOP surface ligands on the CdSe nanocrystal, decreasing the distance between nanocrystals in the film. With decreased distance between nanocrystals, a smaller applied voltage was required to generate electrical current. The applied voltage serves to separate the exciton charge carriers by providing enough energy to overcome the coloumb attraction between the electron and hole. The applied voltage also assists in the tunneling of carriers to a neighboring nanocrystal. The photocurrent for the CdSe nanocrystal films was exponential with voltage while there was a competition between exciton ionization and recombination but once every exciton created in the film was separated into charge carriers the photocurrent displayed a linear dependence on voltage. A transition between the exponential and linear voltage dependence typically occurred at $1.4 \times 10^5$ V/cm in the CdSe nanocrystal films (see Jarosz, M. V., et al., *Physical Review B* 2004, 70, 195327).

The photocurrent of a CdSe/CdTe nanobarbell film treated with butylamine exhibited a linear voltage dependence down to 0 V (lowest field applied is $6 \times 10^3$ V/cm). This indicated that exciton separation was nearly independent of applied voltage and therefore the nanostructure was internally assisting in separating the exciton into carriers. In this way, CdSe/CdTe barbell thin films show good potential as possible active layer in photodetectors and solar cells.

Other embodiments are within the scope of the following claims.

What is claimed is:

1. A semiconductor nanocrystal comprising:
   a central region and a first end, the central region including a first semiconductor material; and
   a distal region at the first end of the nanocrystal, the distal region including a second semiconductor material, wherein the first semiconductor material and the second semiconductor material are selected so that, upon excitation, one charge carrier is substantially confined to the central region and the other charge carrier is substantially confined to the distal region.

2. The nanocrystal of claim 1, further comprising a second distal region at a second end of the central region.

3. The nanocrystal of claim 2, wherein the central region is rod-shaped.

4. The nanocrystal of claim 3, wherein the distal regions are each approximately spherical.

5. The nanocrystal of claim 3, wherein the distal regions are each rod-shaped.

6. The nanocrystal of claim 3, wherein the nanocrystal has a length ratio of between 0.1 and 0.95.

7. The nanocrystal of claim 3, wherein the nanocrystal has a length ratio of between 0.2 and 0.9.

8. The nanocrystal of claim 3, wherein the nanocrystal has a radius ratio of between 0.1 and 10.

9. The nanocrystal of claim 3, wherein the nanocrystal has a radius ratio of between 0.3 and 3.5.

10. The nanocrystal of claim 1, wherein the first semiconductor material is a Group II-VI compound, a Group II-V compound, a Group III-VI compound, a Group III-V compound, a Group IV-VI compound, a Group I-III-VI compound, a Group II-IV-VI compound, or a Group II-IV-V compound.

11. The nanocrystal of claim 10, wherein the first semiconductor material is ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or a mixture thereof.

12. The nanocrystal of claim 1, wherein the second semiconductor material is a Group II-VI compound, a Group II-V compound, a Group III-VI compound, a Group III-V compound, a Group IV-VI compound, a Group I-III-VI compound, a Group II-IV-VI compound, or a Group II-IV-V compound.

13. The nanocrystal of claim 12, wherein the second semiconductor material is ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or a mixture thereof.

14. A photovoltaic device comprising:
a first electrode;
a second electrode;
a voltage source configured to apply a voltage across the first electrode and the second electrode; and
an active layer in electrical communication with the first electrode and the second electrode, wherein the active layer includes a population of semiconductor nanocrystals each having a central region and a first end, the central region including a first semiconductor material, and a distal region at the first end of the nanocrystal, the distal region including a second semiconductor material, wherein the first semiconductor material and the second semiconductor material are selected so that, upon excitation, one charge carrier is substantially confined to the central region and the other charge carrier is substantially confined to the distal region.

15. The device of claim 14, wherein the population of semiconductor nanocrystals are substantially aligned.

16. The device of claim 15, wherein the first electrode and the second electrode are parallel.

17. The device of claim 16, wherein the population of semiconductor nanocrystals are substantially aligned with an alignment direction substantially perpendicular to the first electrode and the second electrode.

18. The device of claim 14, wherein the nanocrystal further includes a second distal region at a second end of the central region.

19. The device of claim 18, wherein the central region is rod-shaped.

20. The device of claim 19, wherein the distal regions are each approximately spherical.

21. The device of claim 19, wherein the distal regions are each rod-shaped.

22. The device of claim 19, wherein the nanocrystal has a length ratio of between 0.1 and 0.95.

23. The device of claim 19, wherein the nanocrystal has a length ratio of between 0.2 and 0.9.

24. The device of claim 19, wherein the nanocrystal has a radius ratio of between 0.1 and 10.

25. The device of claim 19, wherein the nanocrystal has a radius ratio of between 0.3 and 3.5.

26. The device of claim 14, wherein the first semiconductor material is a Group II-VI compound, a Group II-V compound, a Group III-VI compound, a Group III-V compound, a Group IV-VI compound, a Group I-III-VI compound, a Group II-IV-VI compound, or a Group II-IV-V compound.

27. The device of claim 26, wherein the first semiconductor material is ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or a mixture thereof.

28. The device of claim 14, wherein the second semiconductor material is a Group II-VI compound, a Group II-V compound, a Group III-VI compound, a Group III-V compound, a Group IV-VI compound, a Group I-III-VI compound, a Group II-IV-VI compound, or a Group II-IV-V compound.

29. The device of claim 28, wherein the second semiconductor material is ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, LnP, LnAs, InSb, TlN, TlP, TlAs, TlSb, TlSb, PbS, PbSe, PbTe, or a mixture thereof.

* * * * *